(12) United States Patent
Cho et al.

(10) Patent No.: US 11,075,257 B2
(45) Date of Patent: Jul. 27, 2021

(54) ELECTROLUMINESCENCE DISPLAY AND METHOD FOR DRIVING THE SAME

(71) Applicant: LG Display Co., Ltd., Seoul (KR)

(72) Inventors: Hyungnyuck Cho, Paju-si (KR); Jungyoup Suk, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 98 days.

(21) Appl. No.: 16/019,207

(22) Filed: Jun. 26, 2018

(65) Prior Publication Data

US 2019/0006452 A1 Jan. 3, 2019

(30) Foreign Application Priority Data

Jun. 30, 2017 (KR) ........................ 10-2017-0083472

(51) Int. Cl.
*H01L 27/32* (2006.01)
*G09G 3/3233* (2016.01)
(Continued)

(52) U.S. Cl.
CPC ....... *H01L 27/3276* (2013.01); *G09G 3/3233* (2013.01); *G09G 3/3258* (2013.01);
(Continued)

(58) Field of Classification Search
CPC ............ H01L 27/3276; H01L 27/1214; G09G 3/3233; G09G 3/3258; G09G 2300/0819;
(Continued)

(56) References Cited

U.S. PATENT DOCUMENTS

2008/0218452 A1* 9/2008 Kohno ................. G09G 3/3233
345/76
2011/0074757 A1 3/2011 Chung et al.
(Continued)

FOREIGN PATENT DOCUMENTS

KR 10-2015-0071366 A 6/2015
KR 10-2016-0066588 A 6/2016
KR 10-2017-0026929 A 3/2017

OTHER PUBLICATIONS

European Search Report dated Aug. 22, 2018 issued in European Patent Application No. 18176258.4, 13 Pages.

*Primary Examiner* — Patrick N Edouard
*Assistant Examiner* — Eboni N Giles
(74) *Attorney, Agent, or Firm* — Polsinelli PC

(57) ABSTRACT

Provided is an electroluminescence display comprising a display panel where a plurality of pixels connected to a plurality of data lines and a plurality of gate lines are arranged. Each pixel comprises: a driving TFT that controls the current in a light-emitting element EL in response to a data voltage applied to a gate; and switching TFTs that supply a high-level power supply voltage to the driving TFT in response to a gate-on voltage of an emission signal and control signals applied to the source and drain of the driving TFT. The electroluminescence display switches between first and second modes, the first mode being a mode in which data writing and driving TFT characteristic compensation are performed within 1 horizontal period 1H by applying a data voltage to the gate of the driving TFT, and the second mode being a mode in which data writing is performed within the 1 horizontal period by applying an initial voltage to the gate of the driving TFT and applying the data voltage upon completion of the compensation of the driving TFT characteristics.

19 Claims, 11 Drawing Sheets

(51) Int. Cl.
*G09G 3/3258* (2016.01)
*H01L 27/12* (2006.01)

(52) U.S. Cl.
CPC . *H01L 27/1214* (2013.01); *G09G 2300/0819* (2013.01); *G09G 2310/0251* (2013.01); *G09G 2310/0262* (2013.01); *G09G 2310/065* (2013.01); *G09G 2320/0233* (2013.01); *G09G 2320/045* (2013.01)

(58) Field of Classification Search
CPC ... G09G 2310/0251; G09G 2310/0262; G09G 2310/065; G09G 2320/0233; G09G 2320/045
See application file for complete search history.

(56) References Cited

U.S. PATENT DOCUMENTS

| | | | |
|---|---|---|---|
| 2013/0135275 A1* | 5/2013 | Okuno | G09G 3/3291 345/211 |
| 2014/0160185 A1* | 6/2014 | Okuno | G09G 3/3233 345/691 |
| 2016/0171930 A1 | 6/2016 | Song et al. | |
| 2017/0025060 A1* | 1/2017 | Cho | G09G 3/3233 |
| 2019/0147798 A1* | 5/2019 | Hwang | G09G 3/20 345/691 |

\* cited by examiner

ELECTROLUMINESCENCE DISPLAY AND METHOD FOR DRIVING THE SAME

CROSS REFERENCE TO RELATED APPLICATION

This application claims the benefit of Korean Patent Application No. 10-2017-0083472 filed on Jun. 30, 2017, which is incorporated herein by reference in its entirety for all purposes as if fully set forth herein

BACKGROUND

Field of the Disclosure

The present disclosure relates to a display device, more particularly, to an electroluminescence display and a method for driving the same.

Description of the Background

Electroluminescence displays can be classified into inorganic light-emitting displays and organic light-emitting displays depending on the material of an emission layer. Of these, an active-matrix organic light emitting display comprises organic light-emitting diodes (hereinafter, "OLED"), which are typical light-emitting diodes that emit light themselves, and has advantages of fast response time, high luminous efficiency, high brightness, and wide viewing angle.

An OLED of an organic light-emitting display comprises an anode, a cathode, and an organic compound layer situated between these electrodes. The organic compound layer consists of a hole injection layer (HIL), a hole transport layer (HTL), an emission layer (EML), an electron transport layer (ETL), and an electron injection layer (EIL). When a power voltage is applied to the anode and cathode, holes passing through the hole transport layer HTL and electrons passing through the electron transport layer ETL move to the emission layer EML, forming excitons. As a result, the emission layer EML generates visible light An organic light-emitting display has pixels arranged in a matrix form, each pixel comprising an OLED and a driving TFT (thin film transistor), and adjusts the brightness of an image represented by pixels in accordance with the grayscale values of video data. The driving TFT controls the drive current flowing through the OLED in response to a voltage applied between its gate electrode and source electrode (hereinafter, "gate-source voltage"). The light intensity and brightness of the OLED are determined by the drive current.

Generally, when the driving TFT operates in a saturation region, a drive current Ids flowing between the drain and the source of the driving TFT is expressed as follows:

$$Ids = \tfrac{1}{2} * (\mu * C * W/L) * (Vgs - Vth)^2$$

Where $\mu$ is the electron mobility, C is the capacitance of a gate insulator film, W is the channel width of the driving TFT, and L is the channel length of the driving TFT. Vgs is the gate-source voltage of the driving TFT, and Vth is the threshold voltage (or critical voltage) of the driving TFT. Depending on pixel structure, the gate-source voltage Vgs of the driving TFT may be the differential voltage between a data voltage and a reference voltage. Since the data voltage is an analog voltage corresponding to the grayscale value of video data and the reference voltage is a fixed voltage, the gate-source voltage Vgs of the driving TFT is programmed (or set) by the data voltage. The drive current Ids is determined by the programmed gate-source voltage Vgs.

The electrical characteristics of the pixels, such as the threshold voltage Vth of the driving TFT, the electron mobility $\mu$ of the driving TFT, and the threshold voltage of the OLED, should be the same for every pixel since they serve as a factor for determining the drive current Ids. However, the electrical characteristics can vary between pixels, due to various causes including process variation, temporal change, etc.

To compensate for variation in the electrical characteristics of the driving TFT, internal compensation and external compensation may be applied. In the internal compensation method, variation in the electrical characteristics of the driving TFT between pixels is automatically compensated for in real time by using the gate-source voltage of the driving TFT which varies with the electrical characteristics of the driving TFT. In the external compensation method, variation in the electrical characteristics of the driving TFT between pixels is compensated for by sensing the voltage of each pixel varying with the electrical characteristics of the driving TFT and modulating data of an input image by an external circuit based on the sensed voltage.

The present disclosure provides an electroluminescence display that compensates for variation in electrical characteristics such as the mobility, threshold voltage, etc. of the driving TFT and prevents brightness degradation that may occur when compensating for the electrical characteristics of the driving TFT.

SUMMARY

An exemplary aspect of the present disclosure provides an electroluminescence display comprising a display panel where a plurality of pixels connected to a plurality of data lines and a plurality of gate lines are arranged, each pixel comprising: a driving TFT that controls the current in a light-emitting element EL in response to a data voltage applied to a gate; and switching TFTs that supply a high-level power supply voltage to the driving TFT in response to a gate-on voltage of an emission signal and control signals applied to the source and drain of the driving TFT, wherein the electroluminescence display switches between first and second modes, the first mode being a mode in which data writing and driving TFT characteristic compensation are performed within 1 horizontal period by applying a data voltage to the gate of the driving TFT, and the second mode being a mode in which data writing is performed within the 1 horizontal period by applying an initial voltage to the gate of the driving TFT and applying the data voltage upon completion of the compensation of the driving TFT characteristics.

Each pixel comprises a driving TFT that controls the current in the light-emitting element by a gate-source voltage, a first switching TFT that applies a first voltage to the gate of the driving TFT in response to a first scan signal, a second switching TFT that applies a second voltage to the source of the driving TFT in response to a second scan signal, and a third switching TFT that supplies the high-level power supply voltage to the drain of the driving TFT in response to an emission signal, and the electroluminescence display further comprises: a gate drive circuit that generates the scan signals and the emission signal; and a data drive circuit that generates the initial voltage and a data voltage.

In the first mode, a data voltage is applied to the gate of the driving TFT within the 1 horizontal period while the first switching TFT, second switching TFT, and third switching TFT are turned on, and then the electrical characteristics of the driving TFT are compensated for while only the second switching TFT is turned off.

In the second mode, the initial voltage is applied to the gate of the driving TFT in an initial period of the 1 horizontal period while the first switching TFT and the third switching TFT are turned on and the second switching is turned off, and the data voltage is applied to the gate of the driving TFT in the remaining period of the 1 horizontal period while the second switching TFT and the third switching TFT are turned off and the first switching TFT is turned on.

In the second mode, the light-emitting element remains in the off state while the data voltage is applied to the gate of the driving TFT.

During a compensation period for compensating for the characteristics of the driving TFT, the driving TFT is diode-connected by short-circuiting of the gate node and the drain node, and the potential of the gate node is fixed and the potential of the source node differs depending on the characteristics of the driving TFT.

In the first mode, the data drive circuit applies the data voltage to the gate node of the driving TFT through the first switching TFT within the 1 horizontal period.

In the second mode, the data drive circuit supplies the initial voltage to the data lines in an initial period of the 1 horizontal period and supplies the data voltage to the data lines in the remaining period of the 1 horizontal period.

Another exemplary aspect of the present disclosure provides a method for driving an electroluminescence display comprising a display panel where a plurality of pixels connected to a plurality of data lines and a plurality of gate lines are arranged, each pixel comprising: a driving TFT that controls the current in a light-emitting element EL in response to a data voltage applied to a gate; and switching TFTs that supply a high-level power supply voltage to the driving TFT in response to a gate-on voltage of an emission signal and control signals applied to the source and drain of the driving TFT, wherein the electroluminescence display switches between first and second modes, and the method comprises: operating the electroluminescence display in the first mode to perform data writing and driving TFT characteristic compensation within 1 horizontal period by applying a data voltage to the gate of the driving TFT; and operating the electroluminescence display in the second mode to perform data writing within the 1 horizontal period by applying an initial voltage to the gate of the driving TFT and applying the data voltage upon completion of the compensation of the driving TFT characteristics.

A further exemplary aspect of the present disclosure provides An electroluminescence display comprising a display panel where a plurality of pixels connected to a plurality of data lines and a plurality of gate lines are arranged, each pixel includes a gate drive circuit that generates first and second scan signals and an emission signal; a data drive circuit that generates an initial voltage and a data voltage; a driving thin film transistor (TFT) having a gate, a source and drain and controls a current in a light-emitting element EL in response to a data voltage applied to the gate of the driving TFT; and first, second and third switching TFTs that supply a high-level power supply voltage to the driving TFT in response to a gate-on voltage of the emission signal and control signals applied to source and the drain of the driving TFT, wherein the electroluminescence display is driven with switching between first and second modes to compensate for electrical characteristics of the driving TFT and prevent bright degradation of the display panel by performing data writing and driving TFT characteristic compensation a 1 horizontal period and applying a data voltage to the gate of the driving TFT in the first mode, and performing the data writing within the 1 horizontal period and applying an initial voltage to the gate of the driving TFT and applying the data voltage upon completion of the compensation of the driving TFT characteristics in the second mode.

An electroluminescence display according to the present disclosure can compensate for the characteristics of the driving TFT of each pixel and prevent a decrease in brightness caused by voltage drop.

An electroluminescence display according to the present disclosure allows for providing brightness uniformity and preventing a decrease in the brightness of the electroluminescence display, which may occur with characteristic compensation, since a data voltage is applied after the characteristics of the driving TFT are compensated for within 1 horizontal period.

Furthermore, an electroluminescence display according to the present disclosure can minimize voltage loss, which may occur with driving TFT compensation, by writing a data voltage after characteristic compensation is completed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
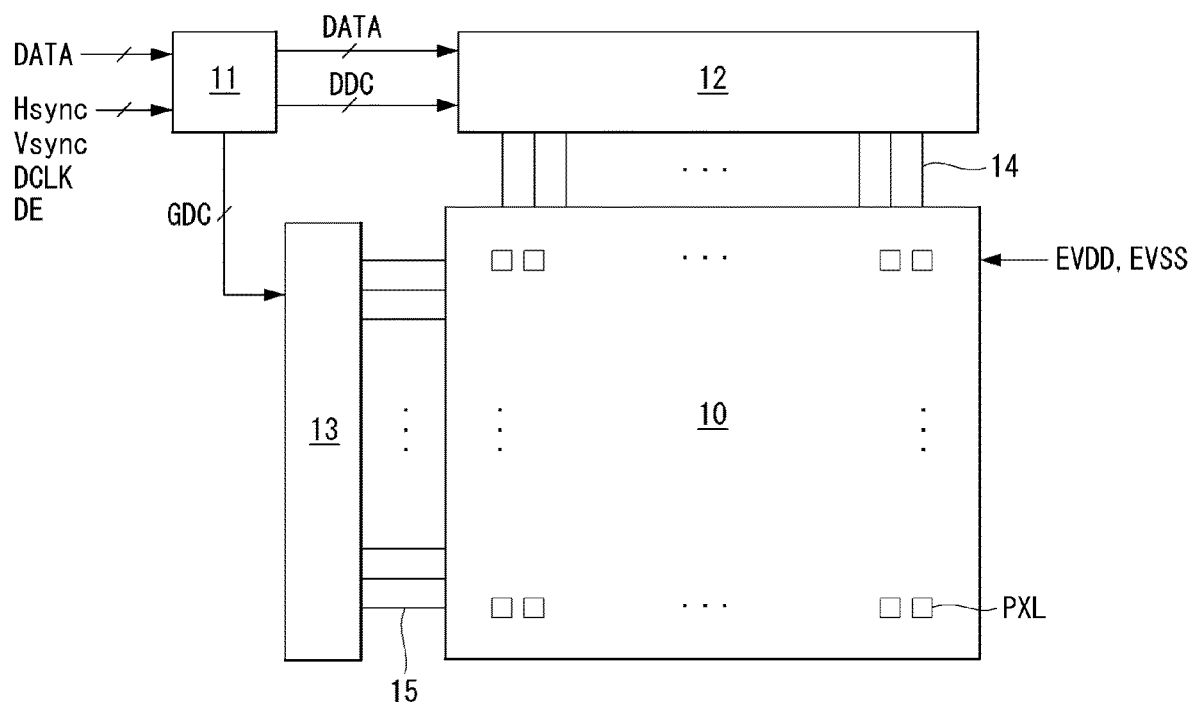
FIG. 1 is a block diagram showing an electroluminescence display according to an exemplary aspect of the present disclosure.

Reference will now be made in detail aspects of the disclosure, examples of which are illustrated in the accompanying drawings.

Various aspects and features of the present disclosure and methods of accomplishing them may be understood more readily by reference to the following detailed descriptions of exemplary aspects and the accompanying drawings. The present disclosure may, however, be embodied in many different forms and should not be construed as being limited to the exemplary aspects set forth herein. Rather, these exemplary aspects are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary aspects of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. Thus, a first element mentioned below could also be termed as a second element without departing from the technical spirit of the present disclosure.

Like reference numerals denote substantially like elements throughout the specification.

The following exemplary aspects of the present disclosure may be coupled or combined with one another either partly or wholly, and may technically interact or work together in various ways. The exemplary aspects may be carried out independently or in connection with one another.

In the present disclosure, pixel circuits and a gate driver which are formed on a substrate of a display panel may be implemented as n-type or p-type MOSFET (metal oxide semiconductor field effect transistor) TFTs. It should be noted that, although the exemplary aspects below illustrate p-type TFTs (PMOS), the present disclosure is not limited to them. A TFT is a three-electrode device with gate, source, and drain. The source is an electrode that provides carriers to the transistor. The carriers in the TFT flow from the source. The drain is an electrode where the carriers leave the TFT. That is, in a MOSFET, carriers flow from the source to the drain. In the case of an n-type TFT (NMOS), the carriers are electrons, and thus the source voltage is lower than the drain voltage so that the electrons flow from the source to the drain. In the n-type TFT, since the electrons flow from the source to the drain, current flows from the drain to the source. In the case of a p-type TFT (PMOS), the carriers are holes, and thus the source voltage is higher than the drain voltage so that the holes flow from the source to the drain. In the p-type TFT, since the holes flow from the source to the drain, current flows from the source to the drain. It should be noted that the source and drain of a MOSFET are not fixed in position. For example, the source and drain of the MOSFET are interchangeable depending on the applied voltage.

In what follows, gate-on voltage is the voltage of a gate signal by which a TFT is turned on, and gate-off voltage is a voltage by which the TFT is turned off. In PMOS, the gate-on voltage is a low voltage L, and the gate-off voltage is a high voltage H. In NMOS, the gate-on voltage is a high voltage H, and the gate-off voltage is a low voltage L.

Hereinafter, various exemplary aspects of the present disclosure will be described in detail with reference to the accompanying drawings. In the exemplary aspects below, the description of the electroluminescence display will focus on an organic light-emitting display comprising organic light-emitting material. However, it should be noted that the technical idea of the present disclosure is not limited to organic light-emitting displays but may apply to inorganic light-emitting displays comprising inorganic light-emitting material.

FIG. 1 shows an electroluminescence display according to an exemplary aspect of the present disclosure.

Referring to FIG. 1, the electroluminescence display according to the exemplary aspect of the present disclosure comprises a display panel 10 with pixels PXL, a data drive circuit 12 for driving a plurality of data lines 14, a gate drive circuit 13 for driving a plurality of gate lines 15, and a timing controller 11 for controlling the operation timings of the data drive circuit 12 and gate drive circuit 13.

The data lines 14 and the gate lines 15 intersect on the display panel 10, and the pixels PXL are arranged in a matrix form and located at the intersections. Pixels PXL in a row are connected to a single gate line 15 comprising at least one scan line and at least one emission line. That is, each pixel PXL may be connected to a single data line 14, at least one scan line, and at least one emission line. The pixels PXL may be commonly supplied with high-level and low-level operating voltages VDD and VSS and an initial voltage Vini from a power generator (not shown). To prevent unnecessary light emission from the OLED in an initial period and a sampling period, the initial voltage Vini may be selected within a voltage range sufficiently lower than the operating voltage of the OLED, and may be set equal to or lower than the low-level operating voltage ELVSS.

The TFTs constituting the pixel PXL may be implemented as oxide TFTs each comprising an oxide semiconductor layer. When electron mobility, process deviation, etc. are all considered, the oxide TFTs are advantageous for a large-sized display panel 10. However, the present disclosure is not limited thereto, but the semiconductor layers of the TFTs may be formed of amorphous silicon, polysilicon, etc. Each pixel PXL comprises a plurality of TFTs and a storage capacitor, in order to compensate for variation in the threshold voltage of the driving TFT. The present disclosure proposes a method for solving the problem of brightness degradation which occurs as compensation time increases.

The timing controller 11 re-aligns digital video data RGB input from an external system board to match the resolution of the display panel 10 and supplies it to the data drive circuit 12. Also, the timing controller 11 generates a data timing control signal DDC for controlling the operating timing of the data drive circuit 12 and a gate timing control signal GDC for controlling the operating timing of the gate drive circuit 13, based on timing signals such as a vertical synchronization signal Vsync, a horizontal synchronization signal Hsync, a dot clock signal DCL, and a data enable signal DE.

The data drive circuit 12 converts the digital video data RGB input from the timing controller 11 to an analog data voltage based on the data control signal DDC.

The gate drive circuit 13 generates a scan signal and an emission signal based on the gate control signal GDC. The gate drive circuit 13 may comprise a scan driver and an emission driver. In order to drive at least one scan line connected to each pixel row, the scan driver may generate a scan signal and provide it to the scan lines on a line-sequential basis. In order to drive at least one emission line connected to each pixel row, the emission driver may generate an emission signal and provide it to the emission lines.

The electroluminescence display of the present disclosure may provide first and second modes for compensating for the electrical characteristics of the driving TFT. The first and second modes are for compensating for the characteristics of the driving TFT. The first mode is a mode in which data writing and driving TFT characteristic compensation are performed simultaneously within 1 horizontal period 1H, and the second mode is a mode in which driving TFT characteristic compensation and data writing are sequentially performed within 1 horizontal period 1H. Compared with the first mode, the second mode allows for compensating for a decrease in brightness of the display panel caused by the first mode operation by minimizing a voltage drop. The electroluminescence display of the disclosure may be designed to switch between the first and second modes at given intervals or to perform compensation in the first mode or second mode depending on the driving condition of the display device.

Figure 2:
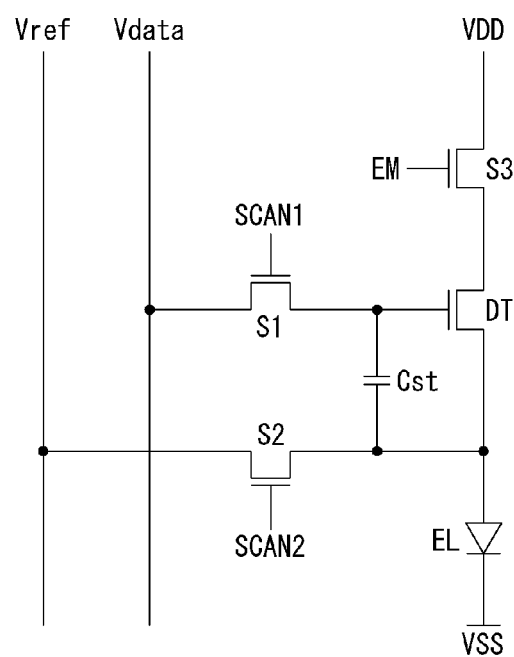
FIG. 2 is a circuit diagram showing an example pixel circuit.

In the electroluminescence display of the present disclosure, as shown in FIG. 2, each subpixel comprises a driving TFT DT that controls the current in a light-emitting element EL by a gate-source voltage Vgs, and a switching TFT S3 that supplies a high-level power supply voltage VDD to the driving TFT DT in response to the gate-on voltage of an EM signal EM.

In this regard, the timing controller 11 may set a compensation time for compensating for the characteristics of the driving TFT DT within 1 horizontal period 1H according to the first mode or second mode, and generate a data control signal DDC and a gate control signal GDC by allowing a source node of the driving TFT to float and compensating for the characteristic of the driving TFT DT between the pixels P during the real-time characteristic compensation time.

FIG. 2 is a view showing a pixel circuit according to an exemplary aspect of the present disclosure.

Referring to FIG. 2, the pixel circuit may comprise a light-emitting element EL, a driving TFT DT, a storage capacitor Cst, a first switching TFT S1, a second switching TFT S2, and a third switching TFT S3. The switching TFTs S1 to S3 and the driving TFT DT may be implemented as n-type MOSFETs.

The light-emitting element EL comprises an organic compound layer situated between an anode and a cathode. The organic compound layer may consist of, but is not limited to, a hole injection layer (HIL), a hole transport layer (HTL), an emission layer (EML), an electron transport layer (ETL), and an electron injection layer (EIL). The cathode CAT of the light-emitting element EL is connected to the low-level power supply voltage VSS, and the anode ANO is connected to the source of the driving TFT DT.

The driving TFT DT is a driving element that controls the current flowing through the light-emitting element EL in response to the gate-source voltage Vgs. The driving TFT DT comprises a gate connected to a second node node2, a source connected to a third node node3, and a drain connected to the first node node1. The second node node2 is connected to the gate of the driving TFT DT, one electrode of the storage capacitor Cst, and the source of the first switching TFT S1. The storage capacitor Cst is connected between the second node node2 and the third node node3. The high-level power supply voltage VDD is applied to the driving TFT DT via the first node node1.

Figure 3:
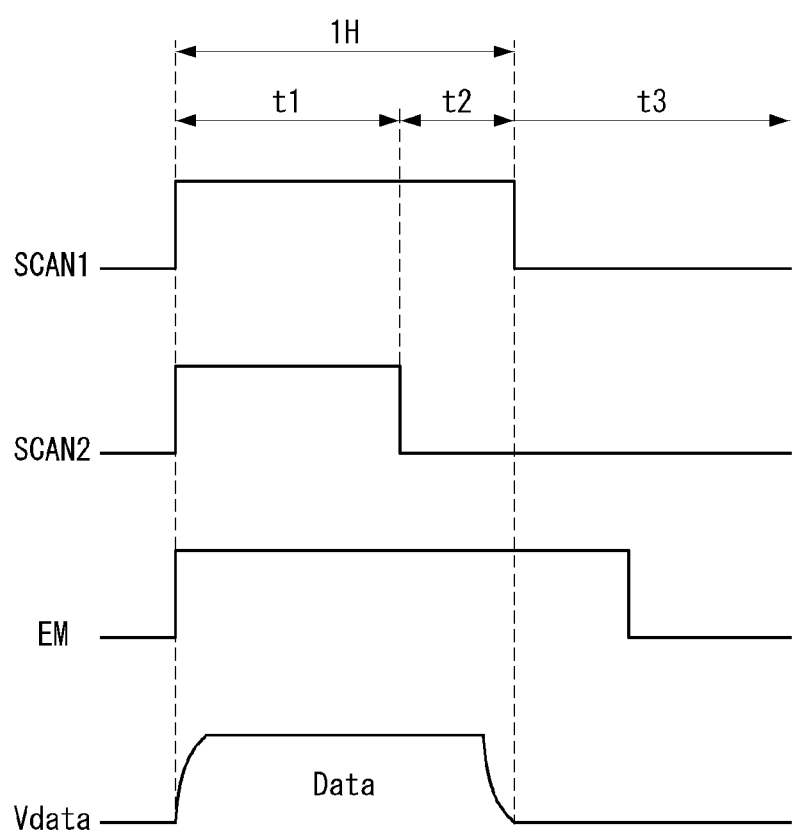
FIG. 3 is a waveform diagram showing drive signal waveforms of a pixel circuit according to an exemplary aspect of the present disclosure.

In this pixel circuit, when the characteristics of the driving TFT DT are compensated for in the first mode, the input signal waveforms are as shown in FIG. 3.

Figure 4A:
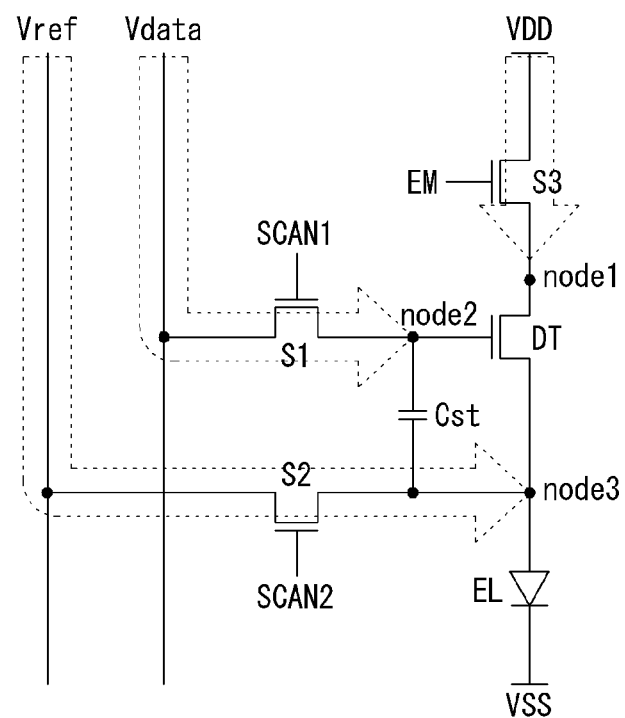
FIGS. 4A to 4C are views showing in steps how the pixel circuit of FIG. 2 works.
Figure 4B:
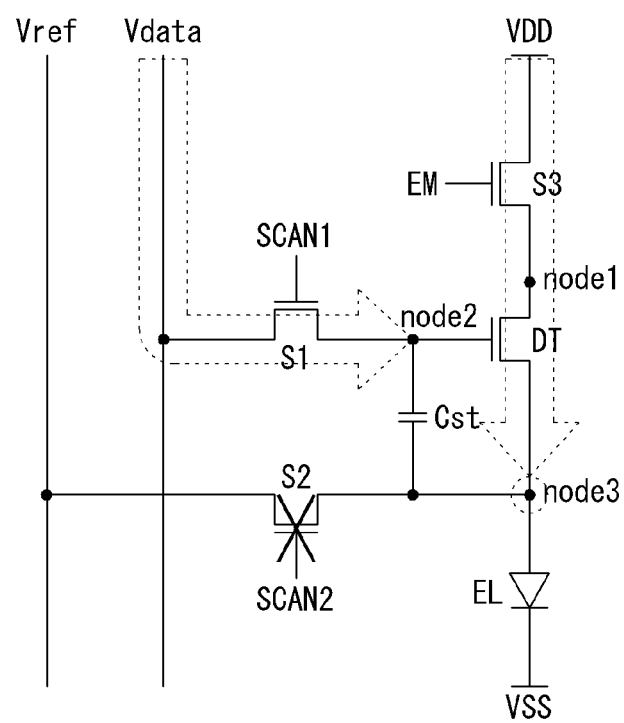
Figure 4C:
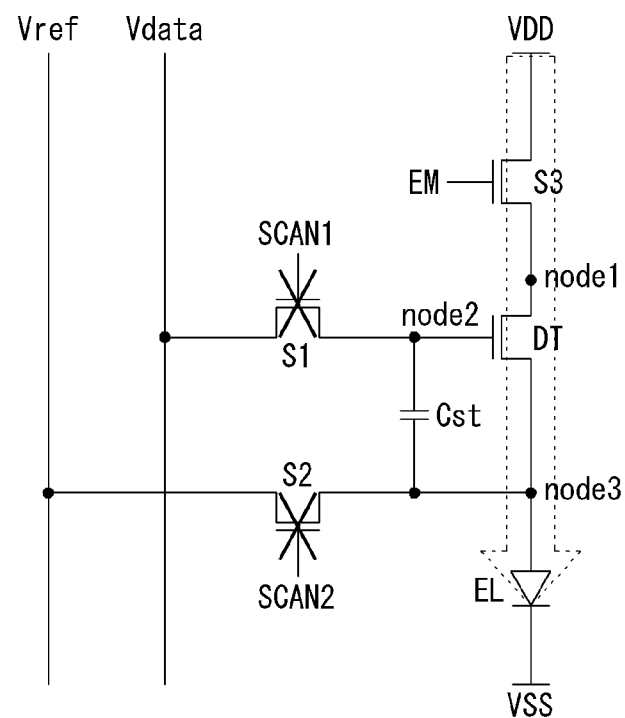

FIG. 3 is a view of drive signal waveforms of the pixel circuit of FIG. 2, which shows the waveforms of drive signals obtained when the characteristics of the driving TFT DT are compensated for in the first mode. In FIG. 3, "1H" represents 1 horizontal period in which data is written to the pixel. FIGS. 4A to 4C are views sequentially showing how the pixel circuit of FIG. 2 works.

As shown in FIG. 3, first and second scan signals SCAN1 and SCAN2, an EM signal EM and a data signal Vdata are applied to the pixel circuit. These signals SCAN1, SCAN2, and EM swing between high voltage and low voltage. The pixel circuit of FIG. 2 comprises n-type MOSFETS, for example, in which case the gate is on in the high-voltage state and off in the low-voltage state. On the other hand, in a case where the pixel circuit comprises p-type MOSFETs, the gate is turned on when the gate voltage is in the low-voltage state. Accordingly, in the description below, a voltage for turning on the gate is called the gate-on voltage, and a voltage for turning off the gate is called the gate-off voltage.

The first scan signal SCAN1 is generated as the gate-on voltage during times t1 and t2 of 1 frame and generated as the gate-off voltage during time t3 and onwards.

The second scan signal SCAN2 is generated as the gate-on voltage during time t1 and generated as the gate-off voltage during time t2 and onwards. The EM signal EM is generated as the gate-on voltage during times t1 and t2 and generated as the gate-off voltage during time t3 and onwards, or may switch on or off the pixels at a preset PWM (pulse width modulation) duty ratio.

According to the signal waveforms of FIG. 3, the first switching TFT S1 of FIG. 2 is turned on in response to the first scan signal SCAN1 during times t1 and t2 to supply a data voltage Vdata to the second node node2. The first switching TFT S1 comprises a gate connected to a first gate line to which the first scan signal SCAN1 is applied, a drain to which the data voltage Vdata is applied, and a source connected to the gate of the driving TFT DT via the second node node2.

The second switching TFT S2 is turned on in response to the second scan signal SCAN2 to form a current path between a sensing line and the first node node1 during time t1. The second switching TFT S2 comprises a gate connected to a second gate line to which the second scan signal SCAN2 is applied, a source to which a predetermined reference voltage Vref is applied, and a drain connected to the source of the driving TFT DT, the anode ANO of the light-emitting element EL, and the other electrode of the storage capacitor Cst via the third node node3. The reference voltage Vref is a voltage lower than the high-level power supply voltage VDD.

The third switching TFT S3 is located between a VDD line and the drain of the driving TFT DT and switches the current path between the VDD line and the driving TFT DT in response to the EM signal EM. The third switching TFT S3 is turned on in response to the gate-on voltage of the EM signal EM during times t1 and t3 to supply the high-level power supply voltage VDD to the drain of the driving TFT DT via the first node node1. The third switching TFT S3 comprises a gate connected to a third gate line to which the EM signal EM is applied, a source connected to the drain of the driving TFT DT via the first node n1, and a drain to which the high-level power supply voltage VDD is applied via the VDD line.

The operation of this pixel circuit will be described in steps with reference to FIGS. 4A to 4C.

During the reset time t1, the switching TFTs S1, S2, and S3 are all turned on in response to the gate-on voltage of the first and second scan signals SCAN1 and SCAN2 and EM signal EM. In this case, as shown in FIG. 4A, the data voltage Vdata is applied to the second node node2. During the reset time t1, the voltage of the third node node3 is the reference voltage Vref, and the voltage of the first node node1 is reset to the high-level power supply voltage VDD. During the reset time t1, the driving TFT DT is turned on since the gate voltage is higher than the source voltage by threshold voltage Vth or above.

Next, during the real-time characteristic compensation time t2, the first switching TFT S1 remains in the on state since the first scan signal SCAN1 is held at the gate-on voltage, whereas the second switching TFT S2 is turned off since the second scan signal SCAN2 is inverted to the gate-off voltage. In this case, the current path of the pixel circuit is as shown in FIG. 4B. During the real-time characteristic compensation time t2, the third node node3 connected to the source of the driving TFT DT floats and the source voltage of the driving TFT DT varies with the characteristics of the driving TFT DT.

The driving TFT DT has a large amount of current between the source and drain if it has high mobility during the real-time characteristics compensation time t2, which leads to a relatively large source voltage and therefore makes Vgs relatively low. On the other hand, the driving TFT DT has a small amount of current between the source and drain if it has low mobility during the real-time characteristics compensation time t2, which leads to a relatively small amount of current discharged from the source voltage and therefore makes Vgs relatively higher. The brightness of the pixel is determined by the current in the light-emitting element EL which is proportional to Vgs of the driving TFT DT. Thus, a pixel A including driving TFT DT having high mobility has a decrease in brightness because of a large reduction in Vgs of the driving TFT DT during the real-time characteristic compensation time t2, whereas a pixel whose driving TFT has relatively low mobility has less decrease in brightness because of a smaller reduction in Vgs of the driving TFT DT during the real-time characteristic compensation time t2.

Figure 5:
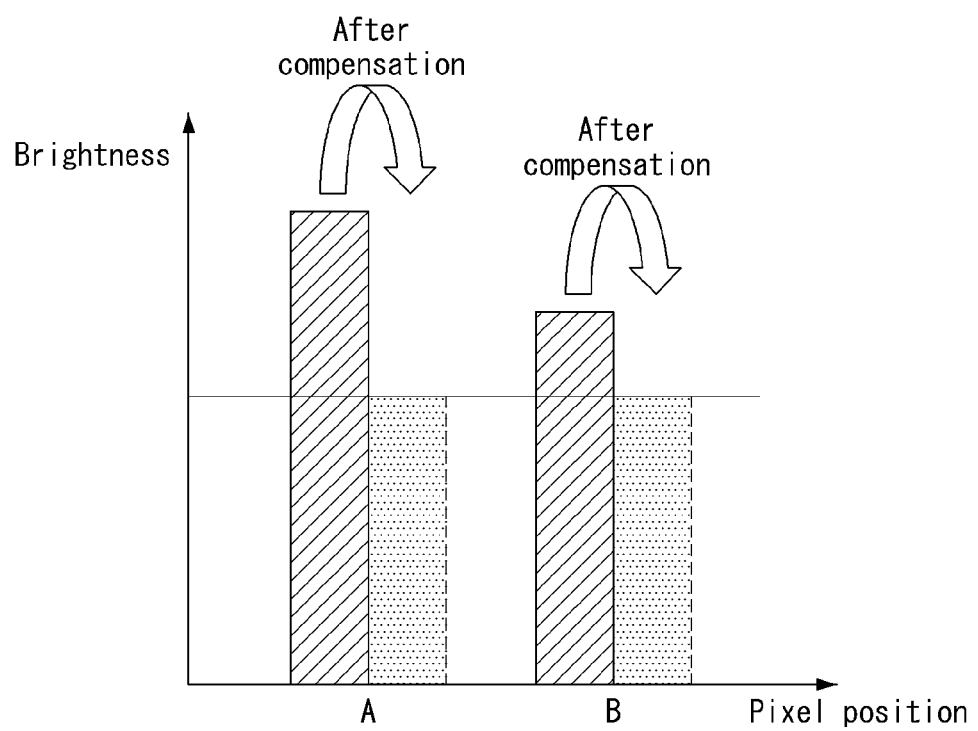
FIG. 5 is a graph showing how brightness is made uniform by compensating for driving TFT characteristics.

Accordingly, as can be seen from the pixel brightness before and after compensation in FIG. 5, variation in the characteristics of the driving TFT DT is compensated for across the entire screen, thus making the brightness of the pixels uniform across the entire screen The above-described compensation process is performed in the first mode to compensate for variation in the characteristics of the driving TFT DT. In the first mode, characteristic compensation is performed for 1H period, and at the same time Vdata is applied. Thus, a voltage drop may occur because current flows upon application of Vdata, and this may lead to a decrease in brightness. Due to this, in the present disclosure, the second mode, which enables brightness compensation, can be performed as well.

Figure 6:
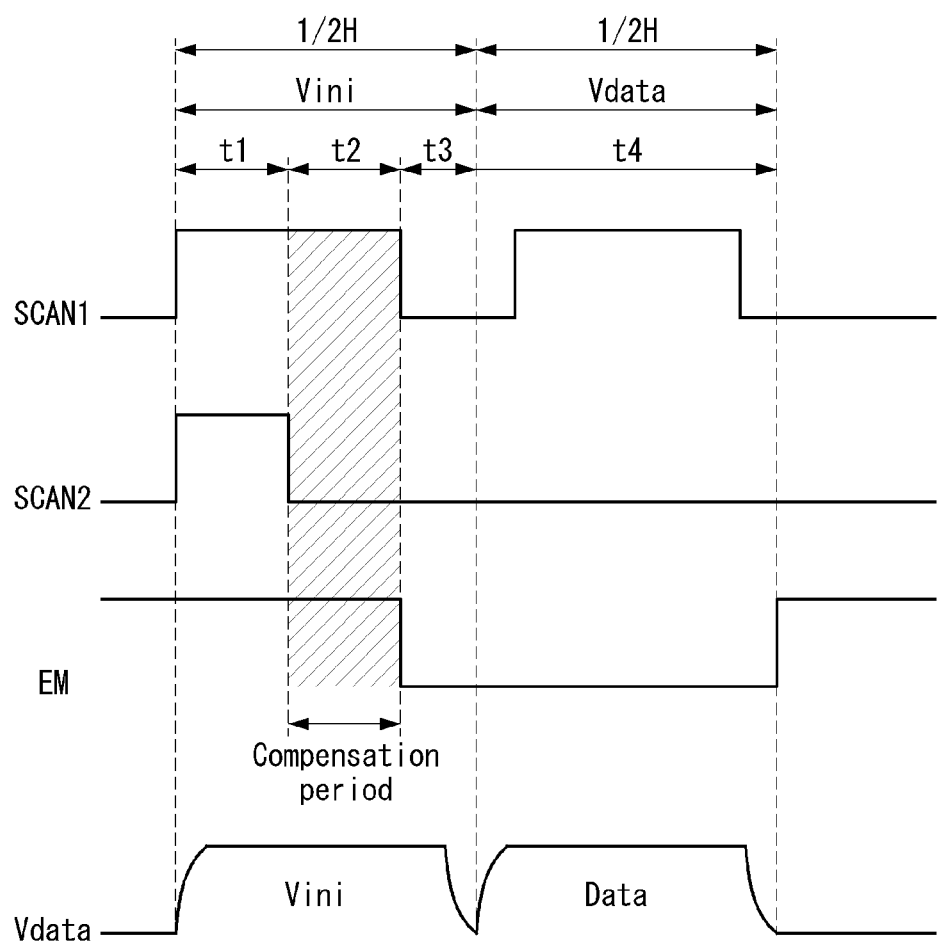
FIG. 6 is a waveform diagram showing drive signal waveforms of a pixel circuit according to another exemplary aspect of the present disclosure.

FIG. 6 shows input signal waveforms obtained when brightness is compensated for in the second mode. In FIG. 6, "1H" represents 1 horizontal period in which data is written to the pixel. In the case of compensation in the second mode, 1H period is divided into an initial period Vini and a data input period Vdata, and characteristic compensation is done in the initial period Vini of ½H and then Vdata is applied during the remaining ½H.

As shown in FIG. 6, first and second scan signals SCAN1 and SCAN2, an EM signal Em and a data signal Vdata are applied. These signals SCAN1 and SCAN2, EM, and Vdata swing between high voltage and low voltage. The pixel circuit of FIG. 2 comprises n-type MOSFETS, for example, in which case the gate is on in the high-voltage state and off in the low-voltage state. On the other hand, in a case where the pixel circuit comprises p-type MOSFETs, the gate is turned on when the gate voltage is in the low-voltage state. Accordingly, in the description below, a voltage for turning on the gate is called the gate-on voltage, and a voltage for turning off the gate is called the gate-off voltage.

The first scan signal SCAN1 is generated as the gate-on voltage and then the gate-off voltage in the initial period Vini of ½H and generated as the gate-on voltage and then the gate-off voltage in the data input period Vdata of ½H.

The second scan signal SCAN2 is generated as the gate-on voltage during time t1 in the initial period Vini of ½H and generated as the gate-off voltage during time t2 and onwards.

The EM signal EM is generated as the gate-on voltage during times t1 and t2 in the initial period Vini of ½H and generated as the gate-off voltage during time t3 and onwards. Thus, the EM signal EM is held at the gate-off voltage in the data input period Vdata of ½H and generated as the gate-on voltage after the end of the data input period Vdata.

According to the signal waveforms of FIG. 6, 1H period is divided into an initial period Vini and a data input period Vdata, and characteristic compensation is done in the initial period Vini of ½H and then data Vdata is applied during the remaining ½H. In the data input period Vdata, the EM signal is held at the gate-off voltage and data is applied while the light-emitting element EL is turned off. Thus, the data drive circuit 12 which supplies the data voltage Vdata has to comprise a component for supplying the initial voltage Vini and a component for supplying the data voltage Vdata.

Upon receiving the signals with the waveforms of FIG. 6, the pixel may operate in the initial period Vini of ½H, as explained with reference to FIGS. 4A to 4C.

During the reset time t1 of ½H, the switching TFTs S1, S2, and S3 are all turned on in response to the gate-on voltage of the first and second scan signals SCAN1 and SCAN2 and EM signal EM. In this case, as shown in FIG. 4A, the initial voltage Vini is applied to the second node node2. During the reset time t1, the voltage of the third node node3 is the reference voltage Vref, and the voltage of the first node node1 is reset to the high-level power supply voltage VDD. During the reset time t1, the driving TFT DT is turned on since the gate voltage is higher than the source voltage by threshold voltage Vth or above.

Next, during the real-time characteristic compensation time t2, the first switching TFT S1 remains in the on state since the first scan signal SCAN1 is held at the gate-on voltage, whereas the second switching TFT S2 is turned off since the second scan signal SCAN2 is inverted to the gate-off voltage. In this case, the current path of the pixel circuit is as shown in FIG. 4B. During the real-time characteristic compensation time t2, the third node node3 connected to the source of the driving TFT DT floats and the amount of current discharged from the source voltage of the driving TFT DT varies with the characteristics of the driving TFT DT.

The driving TFT DT has a large amount of current between the source and drain if it has high mobility during the real-time characteristics compensation time t2, which leads to a relatively large amount of current discharged from the source voltage and therefore makes Vgs relatively low. On the other hand, the driving TFT DT has a small amount of current between the source and drain if it has low mobility during the real-time characteristics compensation time t2, which leads to a relatively small amount of current discharged from the source voltage and therefore makes Vgs relatively higher. The brightness of the pixel is determined by the current in the light-emitting element EL which is proportional to Vgs of the driving TFT DT. Thus, a pixel A including driving TFT DT having high mobility has a decrease in brightness because of a large reduction in Vgs of the driving TFT DT during the real-time characteristic compensation time t2, whereas a pixel whose driving TFT has relatively low mobility has less decrease in brightness because of a smaller reduction in Vgs of the driving TFT DT during the real-time characteristic compensation time t2. Accordingly, variation in the characteristics of the driving TFT DT is compensated for across the entire screen, thus making the brightness of the pixels uniform across the entire screen.

Figure 7:
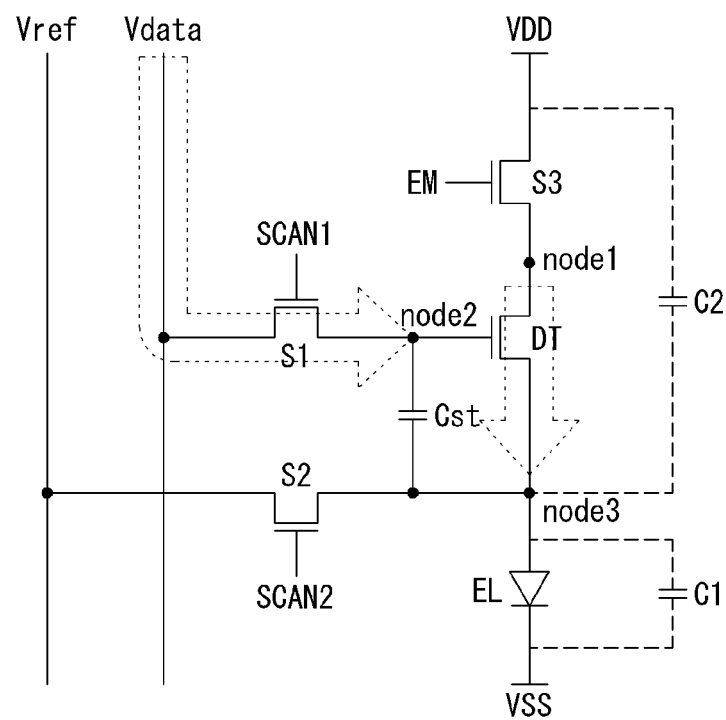
FIG. 7 is a view showing how the pixel circuit works in accordance with the signal waveforms of FIG. 6.

FIG. 7 shows how the pixel works in the data input period Vdata of ½H after the initial period Vini of ½H.

In the data input period Vdata, the first scan signal SCAN1 is generated as the gate-on voltage and the second scan signal SCAN2 and the EM signal EM are generated as the gate-off voltage, thus turning on the first switching TFT S1 and turning off the other switching elements S2 and S3 and the light-emitting element EL.

Afterwards, as shown in FIG. 7, the data voltage Vdata is applied to the second node node2 through the turned-on first switching TFT S1. Since the second and third switching TFTs S2 and S3 and the light-emitting element EL are all turned off, the power supply line from the first node node1 to the third node node3 operates like a capacitor, and the data voltage Vdata is therefore written to the second node node2 of the driving TFT DT.

After time t4, when the first scan signal SCAN1 is inverted to the gate-off voltage and the EM signal EM is inverted to the gate-on voltage, VDD is supplied to the light-emitting element EL in response to Vgs of the driving TFT DT.

As such, in the present disclosure, 1H period is divided into an initial period Vini and a data input period Vdata, and characteristic compensation can be done in the initial period Vini of ½H and then Vdata is applied during the remaining ½H. That is, data Vdata is written after characteristic compensation during 1H to allow the light-emitting element EL to emit light, thereby reducing the voltage drop to less than the threshold voltage Vth.

While the foregoing description has been given of a pixel comprising n-type MOSFETs, the present disclosure may also be applicable to a pixel comprising p-type MOSFETs.

Figure 8:
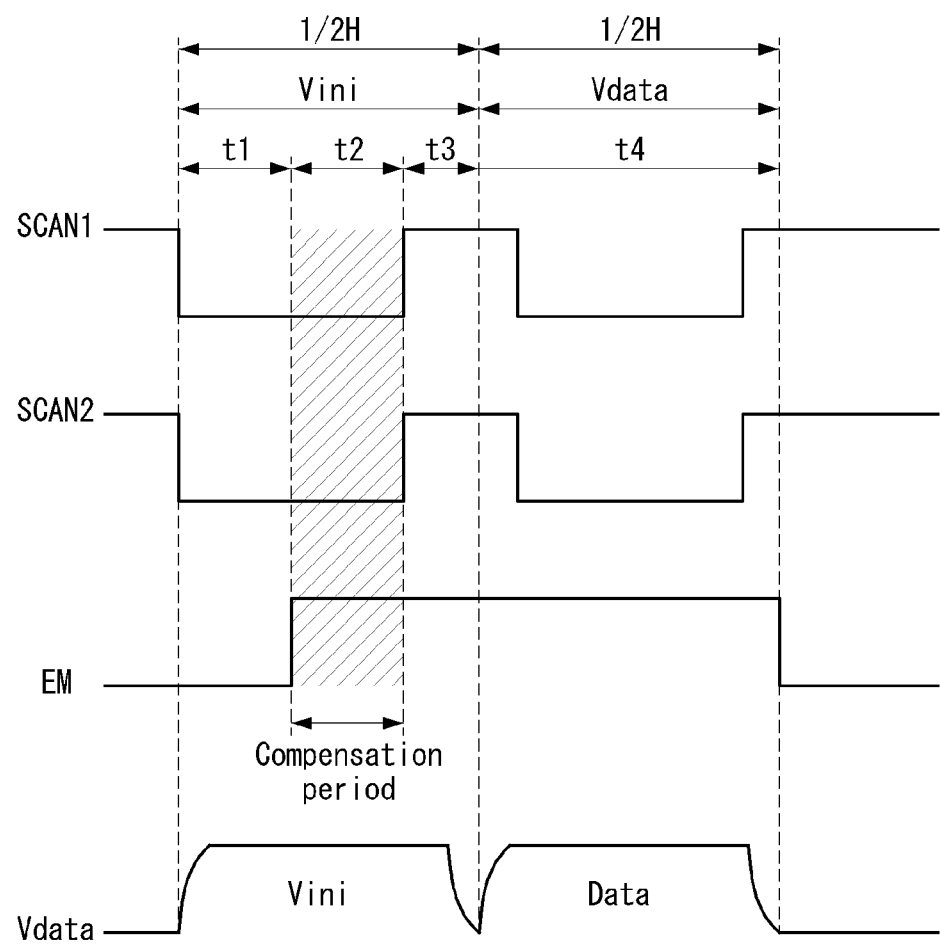
FIG. 8 is a waveform diagram showing drive signal waveforms of a pixel circuit according to yet another exemplary aspect of the present disclosure.
Figure 9:
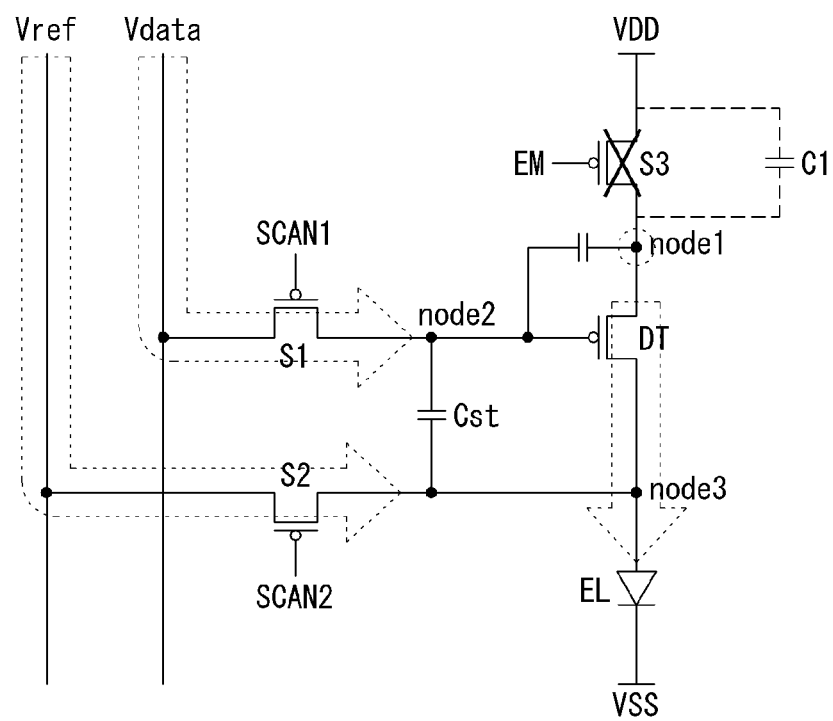
FIG. 9 is a view showing how the pixel circuit works in accordance with the signal waveforms of FIG. 8.

FIGS. 8 and 9 show input signal waveforms applied to a pixel comprising p-type MOSFETs according to an exemplary aspect of the present disclosure and how the pixel works.

FIG. 8 is a waveform diagram of drive signals obtained when the pixel comprising p-type MOSFETs is controlled such that data Vdata is written after characteristic compensation during 1H to allow the light-emitting element EL to emit light. FIG. 9 shows how the pixel works in the data input period Vdata of FIG. 8.

In the case of the p-type MOSFET, the gate is on in the low-voltage state and off in the high-voltage state. Thus, inverted signal waveforms are obtained by inverting the waveforms of signals applied to a pixel comprising n-type MOSFETs. In the description below, a voltage for turning on the gate of the p-type MOSFET is called the gate-on voltage, and a voltage for turning off the gate thereof is called the gate-off voltage.

Referring to FIG. 8, first and second scan signals SCAN1 and SCAN2, an EM signal EM, and a data signal Vdata are applied to the pixel. These signals SCAN1, SCAN2, and EM swing between high voltage and low voltage. In FIG. 8, "1H" represents 1 horizontal period in which data is written to the pixel. In the case of compensation in the second mode, 1H period is divided into an initial period Vini and a data input period Vdata, and characteristic compensation is done in the initial period Vini of ½H and then Vdata is applied during the remaining ½H.

The first scan signal SCAN1 is generated as the gate-on voltage and then the gate-off voltage in the initial period Vini of ½H and generated as the gate-on voltage and then the gate-off voltage in the data input period Vdata of ½H.

The second scan signal SCAN2 is generated as the gate-on voltage and then the gate-off voltage in the initial period Vini of ½H and generated as the gate-on voltage and then the gate-off voltage in the data input period Vdata of ½H.

The EM signal EM is generated as the gate-on voltage during times t1 in the initial period Vini of ½H and generated as the gate-off voltage during time t2 and onwards. Thus, the EM signal EM is held at the gate-off voltage in the data input period Vdata of ½H and generated as the gate-on voltage after the end of the data input period Vdata.

According to the signal waveforms of FIG. 8, 1H period is divided into an initial period Vini and a data input period Vdata, and the electrical characteristics are compensated for in the initial period Vini of ½H and then data Vdata is applied during the remaining ½H. In the data input period Vdata, the EM signal is held at the gate-off voltage and data is applied while the light-emitting element EL is turned off. Thus, the data drive circuit 12 which supplies the data voltage Vdata has to comprise a component for supplying the initial voltage Vini and a component for supplying the data voltage Vdata.

In the pixel circuit of FIG. 9, during the initial period of ½H, the switching TFTs S1, S2, and S3 are all turned on in response to the gate-on voltage of the first and second scan signals SCAN1 and SCAN2 and EM signal EM. In this case, the initial voltage Vini is applied to the second node node2. During the reset time t1, the voltage of the third node node3 is the reference voltage Vref, and the voltage of the first node node1 is reset to the high-level power supply voltage VDD. During the reset time t1, the driving TFT DT is turned on since the gate voltage is higher than the source voltage by threshold voltage Vth or above.

Next, during the real-time characteristic compensation time t2, the first switching TFT S1 remains in the on state since the first scan signal SCAN1 is held at the gate-on voltage, whereas the second switching TFT S2 is turned off since the second scan signal SCAN2 is inverted to the gate-off voltage. During the characteristic compensation time t2, the third node node3 connected to the source of the driving TFT DT floats and the amount of current discharged at the source voltage of the driving TFT DT varies with the characteristics of the driving TFT DT.

The driving TFT DT has a large amount of current between the source and drain if it has high mobility during the real-time characteristics compensation time t2, which leads to a relatively large amount of current discharged at the source voltage and therefore makes Vgs relatively low. On the other hand, the driving TFT DT has a small amount of current between the source and drain if it has low mobility during the real-time characteristics compensation time t2, which leads to a relatively small amount of current discharged at the source voltage and therefore makes Vgs relatively higher. The brightness of the pixel is determined by the current in the light-emitting element EL which is proportional to Vgs of the driving TFT DT. Thus, a pixel A whose driving TFT DT has high mobility has a decrease in brightness because of a large reduction in Vgs of the driving TFT DT during the real-time characteristic compensation time t2, whereas a pixel whose driving TFT has relatively low mobility has less decrease in brightness because of a smaller reduction in Vgs of the driving TFT DT during the real-time characteristic compensation time t2. Accordingly, variation in the characteristics of the driving TFT DT is compensated for across the entire screen, thus making the brightness of the pixels uniform across the entire screen.

In the data input period Vdata, as shown in FIG. 9, the first scan signal SCAN1 is generated as the gate-on voltage and the second scan signal SCAN2 and the EM signal EM are generated as the gate-off voltage, thus turning on the first switching TFT S1 and turning off the other switching elements S2 and S3 and the light-emitting element EL.

The data voltage Vdata is applied to the second node node2 through the turned-on first switching TFT S1. Since the second and third switching TFTs S2 and S3 and the light-emitting element EL are all turned off, the power supply line from the first node node1 to the third node node3 operates like a capacitor, and the data voltage Vdata is therefore written to the second node node2 of the driving TFT DT.

After time t4, when the first scan signal SCAN1 is inverted to the gate-off voltage and the EM signal EM is inverted to the gate-on voltage, VDD is supplied to the light-emitting element EL in response to Vgs of the driving TFT DT.

As such, in the present disclosure, 1H period is divided into an initial period Vini and a data input period Vdata, and characteristic compensation is done in the initial period Vini of ½H and then Vdata is applied during the remaining ½H. That is, data Vdata is written after characteristic compensation during 1H to allow the light-emitting element EL to emit light, thereby reducing the voltage drop to less than the threshold voltage Vth.

From the foregoing description, those skilled in the art will readily appreciate that various changes and modifications can be made without departing from the technical idea of the present disclosure. Therefore, the technical scope of the present disclosure is not limited to what has been stated in the detailed description of the specification but defined by the appended claims.

What is claimed is:

1. An electroluminescence display comprising a display panel where a plurality of pixels connected to a plurality of data lines and a plurality of gate lines are arranged, each pixel comprising:
   a driving thin film transistor (TFT) having a gate, a source and a drain and controls a current in a light-emitting element EL in response to a data voltage applied to the gate of the driving TFT; and
   more than one switching TFTs that supply a high-level power supply voltage to the driving TFT in response to a gate-on voltage of an emission signal and control signals applied to source and the drain of the driving TFT,
   wherein the electroluminescence display is driven with switching between first and second modes, the first mode being a mode in which data writing and driving TFT characteristic compensation are performed within a 1 horizontal period simultaneously, and the second mode being a mode in which data writing is performed after the compensation of the driving TFT characteristics within the 1 horizontal period,
   wherein the more than one switching TFTs include:
      a first switching TFT having a source receiving the data voltage or an initial voltage, a drain connected to the gate of the driving TFT, and a gate receiving a first scan signal;
      a second switching TFT having a source receiving a reference voltage, a drain connected to the drain of the driving TFT, and a gate receiving a second scan signal; and a third switching TFT having a source receiving the high-level power supply voltage, a drain connected to the source of the driving TFT, and a gate receiving the emission signal,
   wherein, in the first mode, the data voltage is applied to the gate of the driving TFT, a reference voltage is applied to the source of the driving TFT, the high-level power supply voltage is applied to the drain of the driving TFT simultaneously during a first period of the 1 horizontal period, and the compensation of the driving TFT characteristic is performed during a second period of the 1 horizontal period by turning off the second switching TFT such that a voltage of the source varies corresponding to the driving TFT characteristic,
   wherein, in the second mode, the initial voltage is applied to the gate of the driving TFT, the reference voltage is applied to the source of the driving TFT, the high-level power supply voltage is applied to the drain of the driving TFT simultaneously during a first period of the 1 horizontal period while the first switching TFT and the third switching TFT are turned on, the compensation of the driving TFT characteristic is performed during a second period of the 1 horizontal period for while only the second switching TFT is turned off such that a voltage of the source varies corresponding to the driving TFT characteristic, and then the data voltage is applied to the gate of the driving TFT during a third period of the 1 horizontal period while the second switching TFT and the third switching TFT are turned off and the first switching TFT is turned on.

2. The electroluminescence display of claim 1, wherein the first switching TFT applies the data voltage or the initial voltage to the gate of the driving TFT in response to the first scan signal, the second switching TFT applies the reference voltage to the source of the driving TFT in response to the second scan signal, and the third switching TFT supplies the high-level power supply voltage to the drain of the driving TFT in response to the emission signal, and the electroluminescence display further comprises:
   a gate drive circuit that generates the first and second scan signals and the emission signal; and
   a data drive circuit that generates the reference voltage, the initial voltage and the data voltage.

3. The electroluminescence display of claim 2, wherein, in the first mode, the data voltage is applied to the gate of the driving TFT within the first period while the first switching TFT, the second switching TFT and the third switching TFT are turned on, and then electrical characteristics of the driving TFT are compensated within the second period while only the second switching TFT is turned off.

4. The electroluminescence display of claim 2, wherein, in the second mode, the light-emitting element remains in an off state while the data voltage is applied to the gate of the driving TFT.

5. The electroluminescence display of claim 2, wherein, during a compensation period for compensating for the characteristics of the driving TFT, the driving TFT is diode-connected by short-circuiting the gate node and the drain node, and a potential of the gate node is fixed and a potential of the source node differs from the potential of the gate node depending on the characteristics of the driving TFT.

6. The electroluminescence display of claim 2, wherein, in the first mode, the data drive circuit applies the data voltage to the gate node of the driving TFT through the first switching TFT within the 1 horizontal period.

7. The electroluminescence display of claim 2, wherein, in the second mode, the data drive circuit supplies the initial voltage to the data lines in the first period of the 1 horizontal period and supplies the data voltage to the data lines in the third period of the 1 horizontal period.

8. A method for driving an electroluminescence display including a display panel where a plurality of pixels connected to a plurality of data lines and a plurality of gate lines are arranged, each pixel including a driving thin film transistor (TFT) that controls a current in a light-emitting element EL in response to a data voltage applied to a gate of the driving TFT; and more than one switching TFTs that supply a high-level power supply voltage to the driving TFT in response to a gate-on voltage of an emission signal and control signals applied to the source and drain of the driving TFT, the method comprising:

operating the electroluminescence display in a first mode to perform data writing and driving TFT characteristic compensation simultaneously within a 1 horizontal period; and operating the electroluminescence display in a second mode to perform the data writing is performed after the compensation of the driving TFT characteristics within the 1 horizontal period, wherein the electroluminescence display is driven with switching between the first mode and the second mode, and wherein the more than one switching TFTs include:

a first switching TFT having a source receiving a data voltage or an initial voltage, a drain connected to the gate of the driving TFT, and a gate receiving a first scan signal;

a second switching ITT having a source receiving a reference voltage, a drain connected to the drain of the driving TFT, and a gate receiving a second scan signal; and a third switching TFT having a source receiving the high-level power supply voltage, a drain connected to the source of the driving TFT, and a gate receiving the emission signal, wherein the operating the electroluminescence display in the first mode comprises:

applying the data voltage to the gate of the driving TFT, applying a reference voltage to the source of the driving TFT, and applying the high-level power supply voltage to the drain of the driving TFT simultaneously during a first period of the 1 horizontal period; and turning off the second switching TFT such that a voltage of the source varies corresponding to the driving TFT characteristic during a second period of the 1 horizontal period, and wherein operating the electroluminescence display in the second mode comprises:

applying the initial voltage to the gate of the driving TFT, applying the reference voltage to the source of the driving TFT, applying the high-level power supply voltage to the drain of the driving TFT simultaneously during a first period of the 1 horizontal period;

turning off the second switching TFT such that a voltage of the source varies corresponding to the driving TFT characteristic during a second period of the 1 horizontal period; and applying the data voltage to the gate during a third period of the 1 horizontal period, wherein, in the second mode, the initial voltage is applied to the gate of the driving TFT in the first period of the 1 horizontal period while the first switching TFT and the third switching TFT are turned on and electrical characteristics of the driving TFT are compensated within the second period for while only the second switching is turned off, and the data voltage is applied to the gate of the driving TFT in the third period of the 1 horizontal period while the second switching TFT and the third switching TFT are turned off and the first switching TFT is turned on.

9. The method of claim 8, wherein the first switching TFT applies the data voltage to the gate of the driving TFT in response to the first scan signal, the second switching TFT applies the reference voltage to the source of the driving TFT in response to the second scan signal, and the third switching TFT supplies the high-level power supply voltage to the drain of the driving TFT in response to the emission signal, and the electroluminescence display further comprises:

a gate drive circuit that generates the scan signals and the emission signal; and a data drive circuit that generates the reference voltage, the initial voltage and the data voltage.

10. The method of claim 9, wherein, in the first mode, the data voltage is applied to the gate of the driving TFT within the first period while the first switching TFT, the second switching TFT and the third switching TFT are turned on, and then electrical characteristics of the driving TFT are compensated within the second period for while only the second switching TFT is turned off.

11. The method of claim 9, wherein, in the second mode, the light-emitting element remains in an off state while the data voltage is applied to the gate of the driving TFT.

12. The method of claim 9, wherein, during a compensation period for compensating for characteristics of the driving TFT, the driving TFT is diode-connected by short-circuiting of the gate node and the drain node, and a potential of the gate node is fixed and a potential of the source node differs depending on the characteristics of the driving TFT.

13. An electroluminescence display comprising a display panel where a plurality of pixels connected to a plurality of data lines and a plurality of gate lines are arranged, each pixel comprising:

a gate drive circuit that generates first and second scan signals and an emission signal;

a data drive circuit that generates an initial voltage and a data voltage;

a driving thin film transistor (TFT) having a gate, a source and drain and controls a current in a light-emitting element EL in response to a data voltage applied to the gate of the driving TFT; and first, second and third switching TFTs that supply a high-level power supply voltage to the driving TFT in response to a gate-on voltage of the emission signal and control signals applied to source and the drain of the driving TFT, wherein the electroluminescence display is driven with switching between first and second modes to compensate for electrical characteristics of the driving TFT and prevent bright degradation of the display panel by performing data writing and driving TFT characteristic compensation a 1 horizontal period and applying a data voltage to the gate of the driving TFT in the first mode, and performing the data writing within the 1 horizontal period and applying an initial voltage to the gate of the driving TFT and applying the data voltage upon completion of the compensation of the driving TFT characteristics in the second mode, and the first switching TFT having a source receiving a data voltage or an initial voltage, a drain connected to the gate of the driving TFT, and a gate receiving a first scan signal;

a second switching TFT having a source receiving a reference voltage, a drain connected to the drain of the driving TFT, and a gate receiving a second scan signal; and a third switching TFT having a source receiving the high-level power supply voltage, a drain connected to the source of the driving TFT, and a gate receiving the emission signal, wherein, in the first mode, the data voltage is applied to the gate of the driving TFT, a reference voltage is applied to the source of the driving TFT, the high-level power supply voltage is applied to the drain of the driving TFT simultaneously during a first period of the 1 horizontal period, and the compensation of the driving TFT characteristic is performed during a second period of the 1 horizontal period by turning off the second switching TFT such that a voltage of the source varies corresponding to the driving TFT characteristic, wherein, in the second mode, the initial voltage is applied to the gate of the driving TFT, the reference voltage is applied to the source of the driving TFT, the high-level power supply voltage is applied to the drain of the driving TFT simultaneously during a first period of the 1 horizontal period while the first switching TFT and the third switching TFT are turned on, the compensation of the driving TFT characteristic is performed during a second period of the 1 horizontal period for while only the second switching is turned off such that a voltage of the source varies corresponding to the driving TFT characteristic, and the data voltage is applied to the gate of the driving TFT during a third period of the 1 horizontal period while the second switching TFT and the third switching TFT are turned off and the first switching TFT is turned on.

14. The electroluminescence display of claim 13, wherein the driving TFT controls the current in the light-emitting element by a gate-source voltage, the first switching TFT applies the data voltage to the gate of the driving TFT in response to the first scan signal, the second switching TFT applies the reference voltage to the source of the driving TFT in response to the second scan signal, and the third switching TFT supplies the high-level power supply voltage to the drain of the driving TFT in response to the emission signal.

15. The electroluminescence display of claim 14, wherein the data voltage is applied to the gate of the driving TFT within the first period in the first mode while the first switching TFT, the second switching TFT and the third switching TFT are turned on, and then the electrical characteristics of the driving TFT are compensated within the second period for while only the second switching TFT is turned off.

16. The electroluminescence display of claim 14, wherein the light-emitting element remains in an off state in the second mode while the data voltage is applied to the gate of the driving TFT.

17. The electroluminescence display of claim 14, wherein the driving TFT is diode-connected by short-circuiting the gate node and the drain node during a compensation period for compensating for the characteristics of the driving TFT, and a potential of the gate node is fixed and a potential of the source node differs from the potential of the gate node depending on the characteristics of the driving TFT.

18. The electroluminescence display of claim 14, wherein the data drive circuit applies the data voltage to the gate node of the driving TFT through the first switching TFT within the 1 horizontal period in the first mode.

19. The electroluminescence display of claim 14, wherein the data drive circuit supplies the initial voltage to the data lines in the first period of the 1 horizontal period and supplies the data voltage to the data lines in the third period of the 1 horizontal period in the second mode.

* * * * *